United States Patent
Kansal et al.

(10) Patent No.: US 9,575,539 B2
(45) Date of Patent: Feb. 21, 2017

(54) VIRTUAL MACHINE POWER CONSUMPTION MEASUREMENT AND MANAGEMENT

(71) Applicant: Microsoft Corporation, Redmond, WA (US)

(72) Inventors: Aman Kansal, Issaquah, WA (US); Jie Liu, Medina, WA (US); Douglas C. Burger, Redmond, WA (US); Arka Aloke Bhattacharya, Kolkata (IN)

(73) Assignee: Microsoft Technology Licensing, LLC, Redmond, WA (US)

(*) Notice: Subject to any disclaimer, the term of this patent is extended or adjusted under 35 U.S.C. 154(b) by 217 days.

(21) Appl. No.: 14/452,451

(22) Filed: Aug. 5, 2014

(65) Prior Publication Data

US 2014/0351613 A1     Nov. 27, 2014

Related U.S. Application Data

(62) Division of application No. 12/714,416, filed on Feb. 26, 2010, now Pat. No. 8,862,914.

(51) Int. Cl.
*G06F 1/32* (2006.01)
*G01R 21/133* (2006.01)
*G06F 11/34* (2006.01)

(52) U.S. Cl.
CPC ........... *G06F 1/3234* (2013.01); *G01R 21/133* (2013.01); *G06F 1/3203* (2013.01); *G06F 1/3206* (2013.01);
(Continued)

(58) Field of Classification Search
CPC ..... G06F 1/3203; G06F 1/3206; G06F 1/3234
See application file for complete search history.

(56) References Cited

U.S. PATENT DOCUMENTS 7,461,276 B2    12/2008    Imada et al.
7,861,102 B1*   12/2010    Ranganathan ........ G06F 1/3206
                                                    713/300
(Continued)

FOREIGN PATENT DOCUMENTS

CN      1755587 A     4/2006
CN    101231552 A     7/2008
(Continued)

OTHER PUBLICATIONS

Bao et al., "HMTT: A Platform Independent Full-System Memory Trace Monitoring System", In Proceedings of the International Conference on Measurement and Modeling of Computer Systems, Jun. 2, 2008, 12 Pages.
(Continued)

*Primary Examiner* — Dennis M Butler
(74) *Attorney, Agent, or Firm* — Steve Wight; Sandy Swain; Micky Minhas

(57) ABSTRACT

Embodiments of the virtual machine power metering system and method measure the power consumption of individual virtual machines. Power meter measurements for a physical host server are converted into individual virtual machine power meters that measure the power consumption of each individual virtual machine residing on the host server. The virtual machine power consumption is computed by generating a power model using the total power consumption of the host server and resource utilization for a virtual machine. Optimal power model coefficients are computed using the power model. The energy used by the virtual machine is computed using one of two embodiments. Embodiments of the system and method also can be used to obtain the power consumption for a specific activity (such as a service, request, or search query). In addition, the virtual machine power metering can be used for virtual machine power
(Continued)

capping to allow power oversubscription in virtualized environments.

20 Claims, 8 Drawing Sheets

(52) U.S. Cl.
CPC ........... *G06F 11/3447* (2013.01); *G06F 1/329* (2013.01); *G06F 1/3228* (2013.01); *G06F 11/3409* (2013.01); *G06F 11/3423* (2013.01); *G06F 11/3466* (2013.01); *G06F 2201/815* (2013.01); *G06F 2201/865* (2013.01); *G06F 2201/88* (2013.01); *Y02B 60/165* (2013.01)

(56) References Cited

U.S. PATENT DOCUMENTS

| | | | |
|---|---|---|---|
| 8,862,914 | B2 | 10/2014 | Kansal et al. |
| 2005/0268078 | A1 | 12/2005 | Zimmer et al. |
| 2006/0069938 | A1 | 3/2006 | Olszewski et al. |
| 2006/0136761 | A1 | 6/2006 | Frasier et al. |
| 2007/0112999 | A1 | 5/2007 | Oney et al. |
| 2008/0177424 | A1 | 7/2008 | Wheeler |
| 2008/0209245 | A1 | 8/2008 | Becker et al. |
| 2008/0229127 | A1 | 9/2008 | Felter et al. |
| 2008/0301473 | A1 | 12/2008 | Perez et al. |
| 2009/0007108 | A1 | 1/2009 | Hanebutte |
| 2009/0113221 | A1 | 4/2009 | Holle et al. |
| 2009/0125293 | A1 | 5/2009 | Lefurgy et al. |
| 2009/0132840 | A1* | 5/2009 | Talwar .............. G06F 1/3203 713/320 |
| 2009/0187775 | A1* | 7/2009 | Ishikawa ........... G06F 1/3203 713/310 |
| 2009/0192762 | A1 | 7/2009 | Lee et al. |
| 2010/0011227 | A1 | 1/2010 | Govindan et al. |
| 2010/0023940 | A1 | 1/2010 | Iwamatsu et al. |
| 2010/0138829 | A1* | 6/2010 | Hanquez .......... G06F 9/5077 718/1 |
| 2011/0004500 | A1* | 1/2011 | Nathuji ............. G06F 1/3203 705/7.37 |
| 2011/0072293 | A1 | 3/2011 | Mazzaferri et al. |

FOREIGN PATENT DOCUMENTS

| | | |
|---|---|---|
| KR | 1020080088041 A | 10/2008 |
| WO | 2009110884 A1 | 9/2009 |

OTHER PUBLICATIONS

Bao et al., "HMTT: A Hybrid Hardware/Software Tracing System for Bridging Memory Trace's Semantic Gap", In Tech Report, Jun. 2011, 16 Pages.

Bellosa, Frank, "The Benefits of Event Driven Energy Accounting in Power-Sensitive Systems", In Proceedings of the 9th Workshop on ACM SIGOPS European Workshop, Sep. 17, 2000, 6 Pages.

Bircher et al., "Complete System Power Estimation: A Trickle-Down Approach Based on Performance Events", In IEEE International Symposium on Performance Analysis of Systems and Software, Apr. 25, 2007, 11 Pages.

Brooks et al., "Wattch: A Framework for Architectural-Level Power Analysis and Optimizations", In Proceedings of the 27th International Symposium on Computer Architecture, Jun. 2000, 12 Pages.

Castro-Leon, Enrique, "Dynamic Power Allocation for Server Groups", In Blog: The Server Room Blog, Jun. 2009, 4 Pages.

Choi et al., "Profiling, Prediction, and Capping of Power Consumption in Consolidated Environments", In IEEE International Symposium on Modeling, Analysis and Simulation of Computers and Telecommunication Systems, Sep. 2008, 10 Pages.

Economou et al., "Full-System Power Analysis and Modeling for Server Environments", In Workshop on Modeling Benchmarking and Simulation, Jun. 2006, 8 Pages.

Fan et al., "Power Provisioning for a Warehouse-Sized Computer", In ACM SIGARCH Computer Architecture News, vol. 35, Issue 2, Jun. 2007, 11 Pages.

Femal et al., "Safe Overprovisioning: Using Power Limits to Increase Aggregate Throughput", In 4th International Conference on Power-Aware Computer Systems, Dec. 2004, 15 Pages.

Flinn et al., "PowerScope: A Tool for Profiling the Energy Usage of Mobile Applications", In Proceedings of the 2nd IEEE Workshop on Mobile Computer Systems and Applications, Feb. 1999, 9 Pages.

Fonseca et al., "Quanto: Tracking Energy in Networked Embedded Systems", In Proceedings of the 8th USENIX Conference on Operating Systems Design and Implementation, Dec. 2008, 16 Pages.

Ganesh et al., "Unleash Stranded Power in Data Centers with RackPacker", In Proceedings of the Workshop on Energy-Efficient Design, Jun. 2009, 7 Pages.

Hamilton, J., "Cost of Power in Large-Scale Data Centers", In Blog, Nov. 2008, 2 Pages.

HP, "Dynamic Power Capping TCO and Best Practices", In White Paper of Hewlett-Packard Development Company, Nov. 2008, 15 Pages.

IBM, "IBM Active Energy Manager", Jun. 25, 2009, Available at: https://web.archive.org/web/20090625134156/http://www-03.ibm.com/systems/management/director/about/director52/extensions/actengmrg.html, 3 pages.

IBM, "Mate: Application Specific Virtual Machines for TinyOS Networks", Oct. 21, 2009, 2 Pages.

Im et al., "Energy Optimization for Latency- and Quality-Constrained Video Applications", In IEEE Council on Electronic Design and Automation, vol. 21, Issue 5, Sep. 2004, 9 Pages.

Isci et al., "Runtime Power Monitoring in High-End Processors: Methodology and Empirical Data", In Proceedings of the 36th Annual International Symposium on Microarchitecture, Dec. 2003, 12 Pages.

Janzen, J., "Calculating Memory System Power for DDR SDRAM", In Journal Designline, vol. 10, Issue 2, 2001, 12 Pages.

Jenne et al., "Dell Energy Smart Architecture (DESA) for 11G Rack and Tower Servers", In White Paper of Dell Inc, 2009, 44 Pages.

Kansal et al., "Virtual Machine Power Metering and Provisioning", In Proceedings of the 1st ACM Symposium on Cloud Computing, Jun. 10, 2010, 12 Pages.

Kim et al., "Understanding the Performance-Temperature Interactions in Disk I/O of Server Workloads", In Proceedings of the 12th International Symposium on High-Performance Computer Architecture, Feb. 2006, 11 Pages.

Koh et al., "An Analysis of Performance Interference Effects in Virtual Environments", In IEEE International Symposium on Performance Analysis of Systems and Software, Apr. 2007, 10 Pages.

Lefurgy et al., "Server-Level Power Control", In Proceedings of the 4th International Conference on Autonomic Computing, Jun. 2007, 10 Pages.

Mahesri et al., "Power Consumption Breakdown on a Modern Laptop", In Proceedings of the 4th International Workshop Power-Aware Computer Systems, Dec. 2004, 10 Pages.

Nathuji et al., "Feedback Driven QoS-Aware Power Budgeting for Virtualized Servers", In Proceedings of the International Workshop on Feedback Control Implementation and Design in Computing Systems and Networks, Apr. 16, 2009, 6 Pages.

Qureshi et al., "Cutting the Electric Bill for Internet-Scale Systems", In Proceedings of the ACM SIGCOMM Conference on Data Communication, Aug. 17, 2009, 12 Pages.

Rawson, Freeman, "Mempower: A Simple Memory Power Analysis Tool Set", In Technical Paper Research for IBM Research, Jan. 21, 2004, 44 Pages.

Rivoire et al., "A Comparison of High-Level Full-System Power Models", In Proceedings of the Conference on Power Aware Computing and Systems, Dec. 2008, 5 Pages.

Sinha et al., "JouleTrack-A Web Based Tool for Software Energy Profiling", In Proceedings of the 38th Design Automation Conference, Jun. 2001, 6 Pages.

Snowdon et al., "Koala: A Platform for OS-Level Power Management", In Proceedings of the 4th ACM European Conference on Computer Systems, Apr. 2009, 14 Pages.

(56) References Cited

OTHER PUBLICATIONS

Stanley-Marbell et al., "Fast, Flexible, Cycle-Accurate Energy Estimation", In Proceedings of the International Symposium on Low Power Electronics and Design, Aug. 2001, 6 Pages.
Stathopoulos et al., "The Energy Endoscope: Real-time Detailed Energy Accounting for Wireless Sensor Nodes", In Proceedings of the 7th International Conference on Information Processing in Sensor Networks, Apr. 2008,14 Pages.
Stewart et al., "Some Joules are More Precious than Others: Managing Renewable Energy in the Datacenter", In Proceedings of the Workshop on Power Aware Computing and Systems, Oct. 2009, 5 Pages.
Stoess et al., "Energy Management for Hypervisor-Based Virtual Machines", In Proceedings of the USENIX Annual Technical Conference, Jun. 2007, 14 Pages.
Tiwari et al., "Instruction Level Power Analysis and Optimization of Software", In Proceedings of the 9th International Conference on VLSI Design, Jan. 1996, 18 Pages.
Urgaonkar et al., "Resource Overbooking and Application Profiling in a Shared Internet Hosting Platform", In Proceedings of the ACM Transactions on Internet Technology, vol. 9, Issue 1, Feb. 2009, 45 Pages.
Zedlewski et al., "Modeling Hard-Disk Power Consumption", In Proceedings of the 2nd USENIX Conference on File and Storage Technologies, Mar. 31, 2003, 14 Pages.
Zeng et al., "ECOSystem: Managing Energy as a First Class Operating System Resource", In Proceedings of the 10th International Conference on Architectural Support for Programming Languages and Operating Systems, Oct. 2002, 10 Pages.
"International Search Report and Written Opinion," From in PCT Application No. PCT/US2011/026353, Mailed Oct. 26, 2011, 10 Pages.
Response filed May 15, 2015 to Second Office Action, From China Patent Application No. 201180011019.0, 19 pages.
Requirement for Restriction/Election mailed Sep. 19, 2012 from U.S. Appl. No. 12/714,416, 5 pages.
Amendment/Response filed Oct. 19, 2012 to Requirement for Restriction/Election mailed Sep. 19, 2012 from U.S. Appl. No. 12/714,416, 7 pages.
Non-Final Office Action mailed Jan. 8, 2013 from U.S. Appl. No. 12/714,416, 9 pages.
Applicant Initiated Interview Summary mailed Apr. 5, 2013 from U.S. Appl. No. 12/714,416, 3 pages.
Response filed May 8, 2013 to Non-Final Office Action mailed Jan. 8, 2013 from U.S. Appl. No. 12/714,416, 12 pages.
Final Office Action mailed Jul. 19, 2013 from U.S. Appl. No. 12/714,416, 10 pages.
Response filed Nov. 18, 2013 to Final Office Action mailed Jul. 19, 2013 from U.S. Appl. No. 12/714,416, 17 pages.
Notice of Allowance mailed Jan. 31, 2014 from U.S. Appl. No. 12/714,416, 5 pages.
Supplemental Amendment filed Apr. 16, 2014 from U.S. Appl. No. 12/714,416, 11 pages.
Notice of Allowance mailed May 9, 2014 from U.S. Appl. No. 12/714,416, 5 pages.
Notice of Allowance mailed Sep. 12, 2014 from U.S. Appl. No. 12/714,416, 2 pages.
Third Office Action mailed Jun. 3, 2015 from Chinese Patent Application No. 201180011019.0, 6 Pages.
Response filed Aug. 18, 2015 to Third Office Action mailed Jun. 3, 2015 from China Patent Application No. 201180011019.0, 13 pages.
"Second Office Action and Search Report," From Chinese Patent Application No. 201180011019.0, Mailed Date: Feb. 28, 2015, 10 pages.
"Response to First Office Action and Search Report of Jul. 8, 2014," From China Patent Application No. 201180011019.0, Filed Date: Nov. 24, 2014, 22 Pages.
Notice of Allowance mailed Dec. 3, 2015 from China Patent Application No. 201180011019.0, 7 pages.
"First Office Action and Search Report Issued in China Patent Application No. 201180011019.0", Mailed Date: Jul. 8, 2014, 14 Pages.

* cited by examiner

VIRTUAL MACHINE POWER CONSUMPTION MEASUREMENT AND MANAGEMENT

CROSS-REFERENCE TO RELATED APPLICATIONS

This patent application is a divisional of, and claims priority from, U.S. patent application Ser. No. 12/714,416 filed on Feb. 26, 2010, which is incorporated herein by reference in its entirety.

BACKGROUND

Data centers, cloud computing infrastructures, compute clusters, enterprise computational facilities, and high performance computing facilities are increasingly using virtual machines to isolate workloads while running the workloads on shared physical servers. A virtual machine is an emulation of a computing device that is strictly software yet acts like a physical computing device. This means that one or more virtual machines can reside on a single physical host server. It appears to clients and all software running on the virtual machines, however, that each virtual machine is an independent server.

Virtualization (or the use of virtual machines) allows multiple applications to be safely placed on a single physical host server because each application operates inside its "virtual" computer and does not affect other applications. This allows server resources to be better utilized and reduces the number of servers required as well as the operational costs of hosting them such as electricity and cooling. Hence, virtualization is an efficient technique for managing computational resources and is gaining widespread acceptance in data centers and large scale computing facilities.

Data centers and other computing facilities often monitor power usage of servers to correctly manage the power capacity and distribution. The power measurement data is also used to make several manual and automated power management decisions. In fact power metering is so widespread in data centers that power distribution units (PDUs), power strips, server power supplies and in newer servers even server motherboards already contain the power metering instruments required to measure power. Another way to measure power consumption in a physical server is to connect a power metering instrument to the server.

Power consumption for a physical server can be measured by metering the electricity supplied to the server. Virtual machines, however, are created in software and there is no easy way to connect a power meter to a virtual machine. This makes it quite difficult to measure power consumption of virtual machines. Techniques used for physical servers can only report the total power draw of the server. But they cannot be used to measure the individual power consumption of each of the multiple virtual machines that reside on the single physical host server. In fact, the power consumption of a virtual machine cannot be measured using purely hardware solutions.

The ability to measure the power consumption of a virtual machine is important. Users or server managers are unable to measure the power used by each virtual machine. Measuring this power is useful for several reasons. For example, if a virtual machine is using excessive power it may have to be shut down or migrated to a different power circuit with excess capacity. In addition, software developers can measure how much energy their software consumes when executed on a physical server but cannot measure it when running on a virtual machine. Not being able to measure the power usage cripples the developer's ability to optimize the software for lower power consumption. Another use of measuring a virtual machine's power consumption is to charge back users based on power use. Shared physical servers, such as used in cloud computing, allow multiple users to run virtual machines on the shared physical infrastructure. The owner of the physical servers may wish to charge the virtual machine users based on power use.

Yet another use of virtual machine power metering, and one that is discussed in more detail below, arises in virtual machine power capping. Power capping allows over-subscription of the power infrastructure and results in more efficient utilization of the power capacity. However, current power capping techniques are designed for physical servers and do not work well when applied to virtual machines. For example, capping the power of a physical server results in the capping of all virtual machines that are hosted on the server. This violates the isolation of workloads provided by virtual machines and can defeat the advantages of using virtualization.

Thus, one of the major components of power management in large scale computational facilities is the visibility into power. This capability, however, is lacking in virtualized machines that are increasingly being used in data centers. The use of virtual machines allows safe isolation of multiple co-located workloads, enabling multiple workloads to be consolidated on fewer servers, and results in improved resource utilization. However, the lack of visibility into virtual machine power usage takes away the many advantages of server power metering that were available without virtualization.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments of the virtual machine power metering system and method measure the power consumption of individual virtual machines. Power metering is often used on physical servers to make several power management and operational decisions. Embodiments of the virtual machine power metering system and method allow such decisions to be made also on virtual machines.

The general idea is that a power meter measurement, which measures the power consumption of an entire physical host server, is converted into individual virtual machine power meters that measure the power consumption of each individual virtual machine residing on the host server. Embodiments of the virtual machine power metering system and method will work with any number of virtual machines and work across multiple physical host servers.

Knowing the power consumption of an individual virtual machine is useful for several power management decisions that are made in a data center or any virtualized server. For example, the virtual machine power metering can be used for virtual machine power capping to allow power oversubscription in virtualized environments. This virtual machine power capping can be performed without violating the isolation property. The individual virtual machine power consumption measurements also can be used to track the power consumption of an activity (such as a search query) that spans multiple virtual machines.

Embodiments of the virtual machine power metering system and method do not need the hardware to supply a power model. Any information needed is learned on the fly. Embodiments of the system and method automatically learn a power model relating the hardware (or resource) usage (such as central processing unit (CPU) usage, disk usage, memory usage, network, usage, and so forth) to power consumption. Then the hardware usage of each virtual machine is tracked to infer the power consumption of the virtual machine.

Embodiments of the system and method compute the power consumption in two broad steps. First, a power model is generated and trained using the total power consumption of the physical host server and resource utilization for a specific virtual machine. Resource utilization is the determination of how much of a resource the virtual machine is using. These resource utilizations are summed to find a total resource utilization for the virtual machine. The power model is generated that relates the total resource utilization to the total power consumption.

Embodiments of the system and method also determine optimal power model coefficients during this step. This is achieved by determine the number of resources, N, being used by the virtual machine. A system of N equations having N unknowns is generated and solved to obtain the optimal power model coefficients.

Embodiments of the system and method also include a power model learning technique, where the model learned is unique to the workloads hosted within each virtual machine. This accounts for differences in power usage among workloads that can be seen even when the workloads have the same or similar appearing resource usage.

Second, embodiments of the system and method calculate the energy used by the virtual machine. Several embodiments may be used to calculate the energy. One embodiment uses the percentages of resources used by the virtual machine and then sums these percentages to obtain the power consumption for the virtual machine. In other embodiments, the resources used may be measured in units other than percentages. By way of example, resources measured may include the CPU, memory, disks, network cards, and fans, to name a few. In these embodiments the power model can be augmented by taking into account the frequency of the CPU of the host server.

Embodiments of the system and method can also be used to obtain the power consumption for a specific activity. An activity can be a service, a request (such as a web search query), an e-mail delivery, a webpage retrieval, a database operation, or a file update. The power consumption for the activity can be computed even if the activity is across multiple virtual machines and across multiple host servers. An activity period, which is the period of time that the activity is active on the computing infrastructure, is determined. Embodiments of the system and method then compute the power consumption by summing power consumption for each virtual machine working on the activity during the respective activity periods to obtain total activity power consumption.

It should be noted that alternative embodiments are possible, and that steps and elements discussed herein may be changed, added, or eliminated, depending on the particular embodiment. These alternative embodiments include alternative steps and alternative elements that may be used, and structural changes that may be made, without departing from the scope of the invention.

DRAWINGS DESCRIPTION

Referring now to the drawings in which like reference numbers represent corresponding parts throughout:

DETAILED DESCRIPTION

Figure 1:
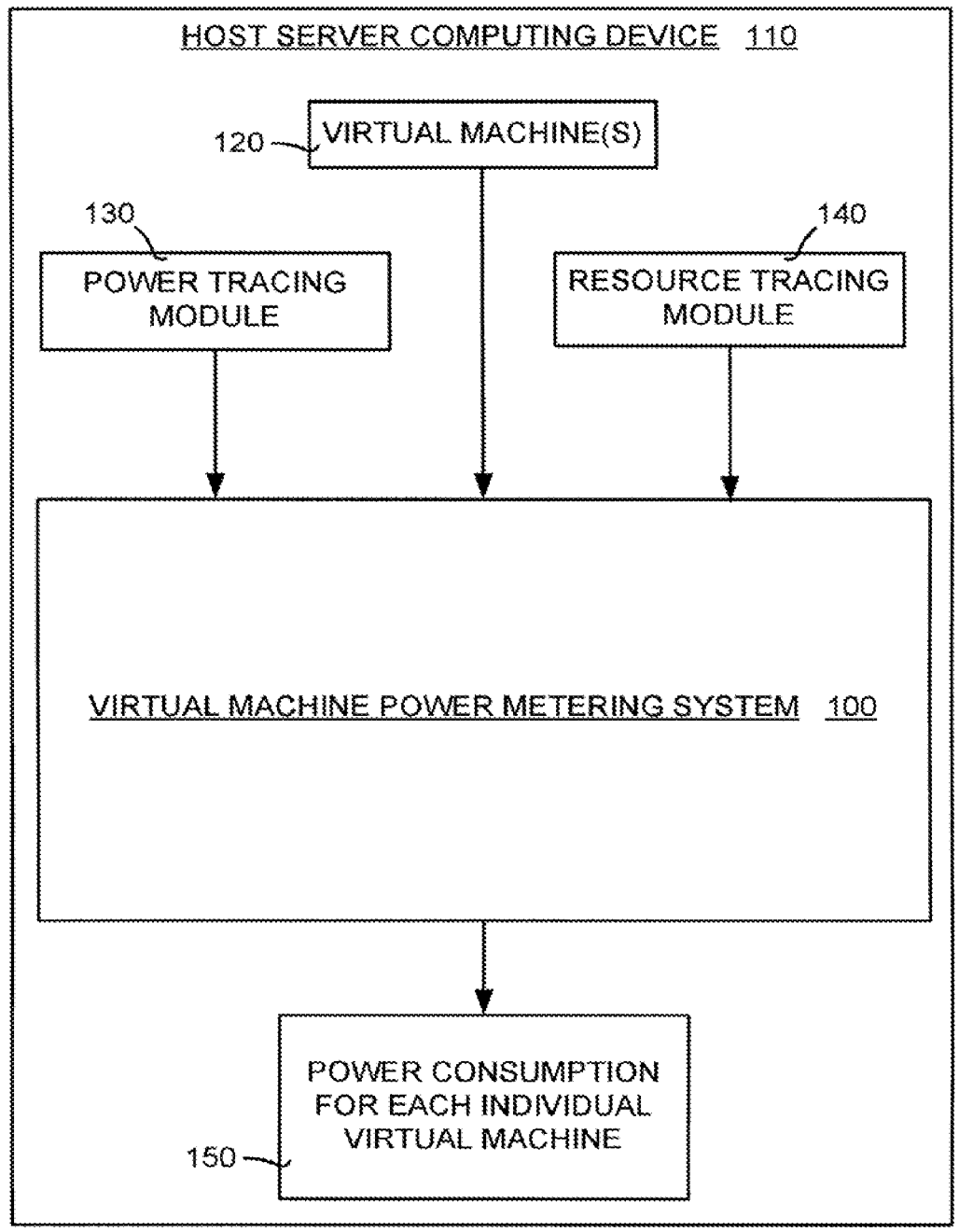
FIG. 1 is a block diagram illustrating a general overview of embodiments of the virtual machine power metering system and method implemented on a host server computing device.

In the following description of embodiments of the virtual machine power metering system and method, reference is made to the accompanying drawings, which form a part thereof, and show, by way of illustration, a specific example whereby embodiments of the virtual machine power metering system and method may be practiced. It is to be understood that other embodiments may be utilized and structural changes may be made without departing from the scope of the claimed subject matter.

I. Power Metering Concepts

Since no hardware power measuring device can be connected to an individual virtual machine, the virtual machine power metering system and method infers energy from resource usage. In principle, the virtual machine power metering system and method tracks the resources used by each virtual machine in software and then converts the resource usage to energy by leveraging the power models of the individual resources.

For this approach, the system and method track usage for all the hardware resources, such as the CPU cores, disk arrays, memory banks, network cards, and graphics cards. Tracking the resource usage includes determining what power state the resource was in and what virtual machine was it working for. If the system and method correctly label each resource according to which virtual machine was using it and also measure the power draw during that duration (typically a few microseconds or milliseconds), then the system and method can compute the active energy usage of each virtual machine. The active energy may be defined as the energy consumed by a resource when working on behalf of some virtual machine or the system.

In addition to the active energy, the system also uses some idle energy and shared energy. By way of example, for the CPU, the idle energy could include the energy spent in a sleep state for a small duration between active states. The shared energy includes energy used by a resource when the work performed benefits multiple virtual machines, such as the energy spent on disk spin-up before input/output operations from multiple virtual machines. Some of the idle energy is spent regardless of whether any virtual machine is running or not while part of it is affected by the presence of virtual machines.

For instance the time durations between a virtual machine's idle periods may affect whether a deeper sleep state is used by the processor or not during the idle time. The idle and shared energies can be reported separately or divided among virtual machines either equally or proportional to their active energy usage, depending on how the metering information is to be used. For the power capping application discussed in detail below, reporting separately works best.

Thus, tracking virtual machine energy boils down to two challenges. First, power measurement at microsecond or millisecond granularity: The instantaneous power should be determined every few microseconds for each resource, since the virtual machine using the resource may change every few microseconds (depending on time period used for context switching). This may cause the component usage and power state to change.

Second, label resource use for each individual virtual machine. It must be determined which virtual machine was responsible for using each resource. Ideally, this process does not require the application source code running inside a virtual machine to be instrumented, since the platform developers may not have access to it and requiring application developers to instrument their source code is unlikely to scale in practice.

In order to address the first challenge, embodiments of the system and method leverage power models that relate the software-observable state of a resource to its power usage. If the state changes can be observed at microsecond granularity then the power usage at that fine time scale can be inferred. Observing the power states is non-trivial and several approximations must be made. For instance, the resource states, such as the clock gating of sub-components within the processor or exact nature of mechanical motions within a disk array may not be completely known in some embodiments of the method and system. Moreover, there may be no visibility into power states of certain hardware resources within the platform, such as hardware-controlled device power states or graphics processor activity.

After observing the resource state, the next step is to determine the power usage in that state using its power model. However, power models are not readily available. Embodiments of the system and method build the power models in situ. To address the second challenge, embodiments of the system and method leverage the knowledge regarding scheduling of resources for the virtual machines. Again, complete visibility into all resources is lacking and trade-offs in instrumentation overhead and accuracy must be made.

II. System Overview

FIG. 1 is a block diagram illustrating a general overview of embodiments of the virtual machine power metering system 100 and method implemented on a host server computing device 110. In general, embodiments of the virtual machine power metering system 100 and method determine the power consumption of individual virtual machines running on the host server computing device 110 without the need to special hardware.

Embodiments of the virtual machine power metering system 100 reside on the host server computing device 110. The host server computing device 110 represents a physical server. One or more virtual machines 120 are hosted by the host server computing device 110. These one or more virtual machines 120 can be represented as $VM_1, VM_2, \ldots$ to $VM_N$, where N is the number of virtual machines. A power tracing module 130 measure the full system power, or the total power consumed by the host server computing device 110. In some embodiments, the power tracing module 130 represents a software driver to read the full system power consumption from an available power sensor on the motherboard of the host server computing device 110.

A resource tracing module 140 represents hypervisor performance counters that trace the resource usage of virtual machines. A hypervisor (also known as a virtual machine manager) is management software that that allows multiple operating systems to run on a host computer concurrently. The resource tracing module 140 tracks the resources of the host server computing device 110. To keep embodiments of the virtual machine power metering system 100 usable with existing hypervisors, embodiments of the system 100 use existing hypervisor performance counters. However, in some embodiments of the system and method additional performance counters and instrumentation can be added to monitor resource usage where usability with existing hypervisors is not essential. Embodiments of the system 100 process this information to compute and output power consumption for each virtual machine 150.

Figure 2:
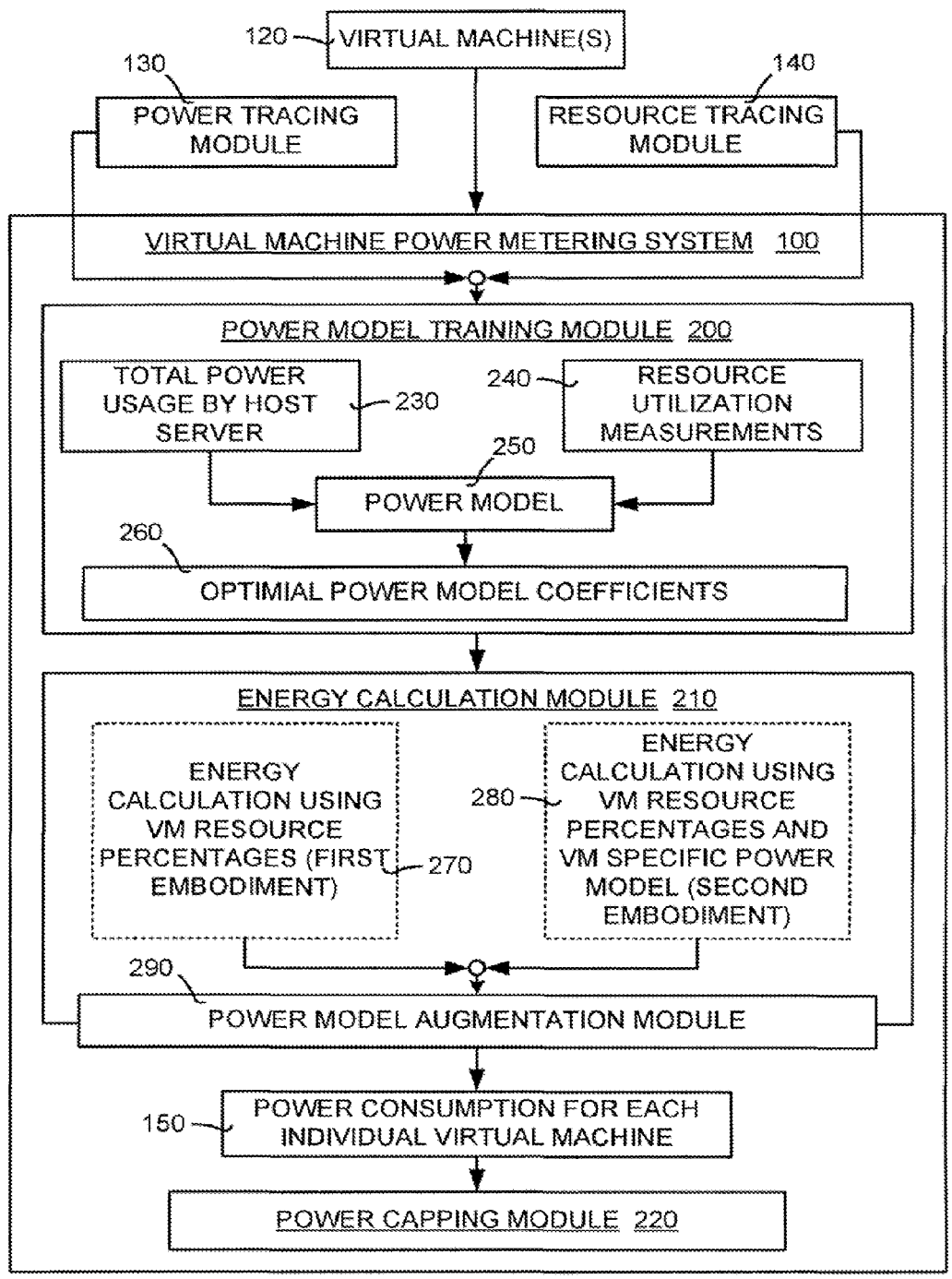
FIG. 2 is a block diagram illustrating modules and data used in embodiments of the virtual machine power metering system and method shown in FIG. 1.

FIG. 2 is a block diagram illustrating modules and data used in embodiments of the virtual machine power metering system 100 and method shown in FIG. 1. In general, embodiments of the virtual machine power metering system 100 include modules for power measurement and management in virtual machines. More specifically, embodiments of the virtual machine power metering system 100 include a power model training module 200 that generates a power model based on information from the power tracing module 130 and the resource tracing module 140. In some embodiments of the module 200 the power model is further refined by taking into account the frequency of the central processing unit (CPU).

Embodiments of the system 100 also include an energy calculation module 210 that uses the power model to compute the power consumption for each of the one or more virtual machines 120. As explained below, embodiments of this module use at least two embodiments to obtain the power consumption. The result is the power consumption for each individual virtual machine 150. This information is used by a power capping module 220 to provide power limitations for each virtual machine as desired.

The power model training module 200 uses total power usage by the host server 230 and resource utilizations measurements 240 to generate a power model 250. As explained in detail below, a number of measurements are taken to obtain a system of power model equations. This system of equations is solved to find optimal power model coefficients 260.

The energy calculation module 210 uses the power tracing module 130 information, the resource tracing module 140 information, and the optimal power model coefficients 260 to calculate the power consumption for each of the one or more virtual machines 120. There are two embodiments of the energy calculation module 210, as shown by the dotted lines in FIG. 2.

A first embodiment of the energy calculation module 210 uses virtual machine resource percentages to make the calculations 270. In this embodiment the coefficient used is the same for each of the virtual machines. For example, if two virtual machines both use 10% CPU (and no other resources) then their energy use will be the same. A second embodiment of the module 210 uses virtual machine resource percentages and a virtual machine specific power model to make the energy calculations 280. In this embodiment, as an example, even with both virtual machines using 10% CPU each the energy use could be different because one virtual machine could be performing floating point operations while the other virtual machine could be performing fixed point operations (these two operations use different sub-units of the CPU and hence may use different amounts of energy).

The mathematical details of both embodiments are discussed below. Both of these embodiments are refined by adding slightly to the complexity of the power model by using a power model augmentation module 290. The power model augmentation module 290 augments the power model by taking into account the frequency of the central processing unit (CPU) of the host server computing device 110.

The result is the power consumption for each individual virtual machine 150. This result then is used by the power capping module 220 to cap the power used by each virtual machine. The details of the power capping process are discussed in detail below.

III. Operational Overview

Computational activities in a computing infrastructure (such as a data center) often consist of multiple tasks performed by multiple virtual machines or server roles hosted on different physical machines. For example, a search query may be first received by a web front end service (also referred to as web frontend server role) and may be hosted inside a virtual machine. The search query then may be processed by multiple search data retrieval servers, advertisement servers, and content-rendering servers. The results of the processing are collected and sent to the user.

As another example, an activity may consist of receiving an email for a particular user. First an incoming-email server role (possibly hosted within a virtual machine) will receive the message and determine the correct user account for the message. A virus-scanning server may check the contents of the email message. A spam-filtering server may check the contents of the message as well. Then a storage server may place the message in its storage. The activity in each case involves expenditure of energy on multiple distributed server roles some of which could be hosted on the same machine and some on different machines. It is desirable to determine the energy used by the activity as a whole.

Figure 3:
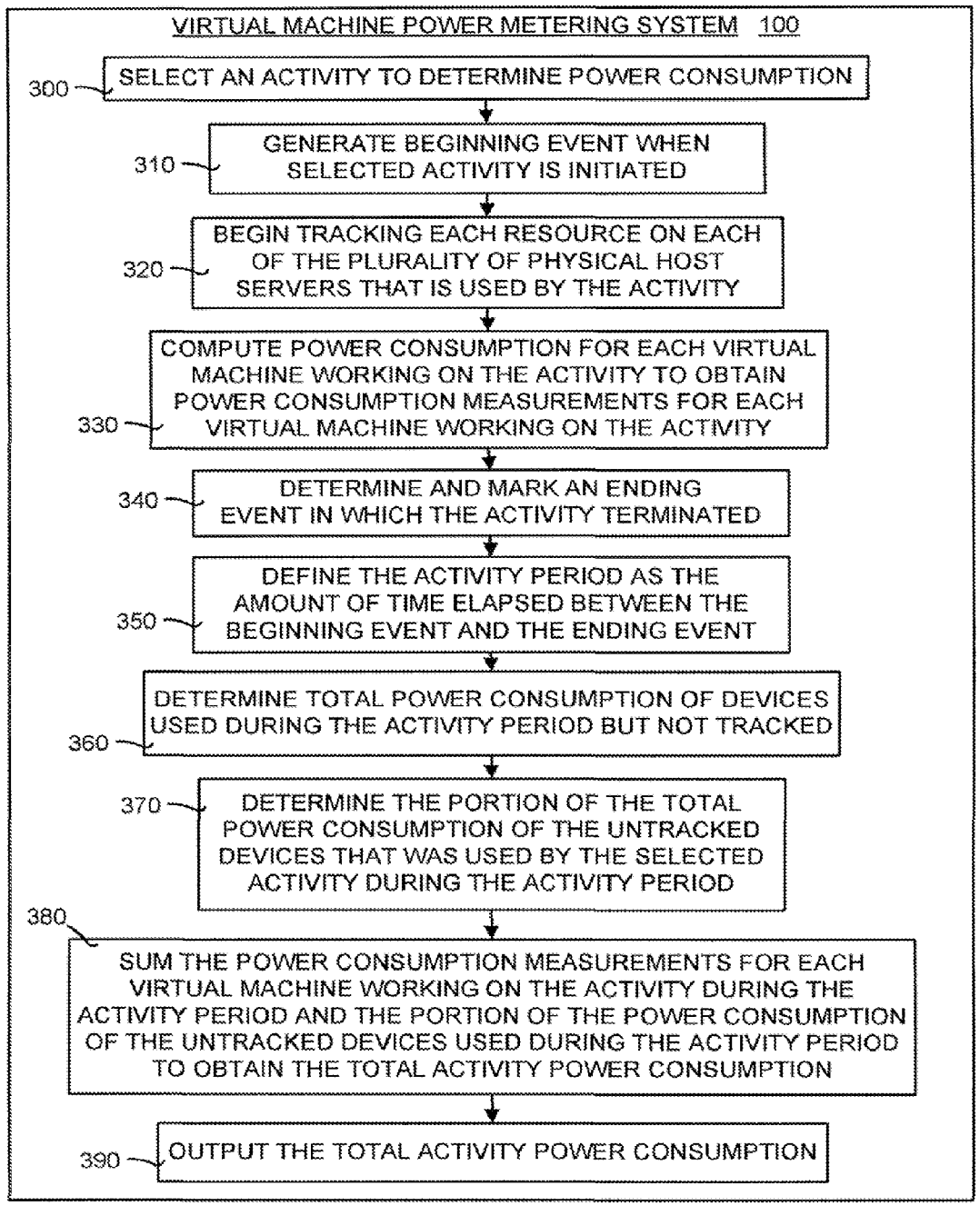
FIG. 3 is a flow diagram illustrating the general operation of embodiments of the virtual machine power metering system shown in FIGS. 1 and 2

FIG. 3 is a flow diagram illustrating the general operation of embodiments of the virtual machine power metering system 100 shown in FIGS. 1 and 2. In general, embodiments of the virtual machine power metering system 100 and method to determine the energy usage of an individual activity that may be distributed over several virtual machines. An activity is defined as a service or request. For example, a search query is an activity that has a verifiable beginning and end.

Referring to FIG. 3, the method begins by selecting an activity for which to determine the power consumption (box 300). The activity spans at least one virtual machine on each of a plurality of physical host servers. Next, a beginning event is generated when the activity is first initiated on the virtual machine (box 310). This beginning event marks the beginning of the tracking of each resource that is used by the activity (box 320). When an activity uses a particular virtual machine the energy usage (or power consumption) of the relevant virtual machine is determined over the duration of the activity's use (box 330).

It should be noted that the activity could start and end on different virtual machines at different times. For example, in the e-mail example just given a virtual machine may start virus scanning the e-mail at time $T_1$ and end the scanning at time $T_2$. Another virtual machine may then start analyzing the same e-mail for spam at time $T_3$ and end the analysis at time $T_4$, The power consumption of each virtual machine may be determined using the virtual machine power metering methods described in detail below. This generates power consumption measurements for each virtual machine working on the selected activity. As the activity progresses, the energy used across multiple server roles is added up to generate the total energy used by the activity.

Embodiments of the system 100 then determine and mark an ending event in which the activity was terminated (box 340). This ending event may be the fulfillment of a search request, or some other event that marks the time at which the activity was completed or terminated and presented to a user. An activity period is defined as the amount of time between the beginning event and the ending event (box 350).

In addition, some energy may be spent by devices that are not part of the computing infrastructure as tracked by the virtual machine power metering method. These could include cooling equipment for the computing facility and such peripherals. The energy used in these devices is estimated as follows. Embodiments of the system 100 determine the total power consumption of devices that were used during the activity period but that were not tracked (box 360).

The total energy used by these devices is measured using hardware power metering or using known power models (based on specifications and data sheets or learned in situ). The portion of the total power consumption that was used by the selected activity during the activity period then is determined (box 370). The total energy may be apportioned equally among all activities, divided in the ratio of their execution times, or in the ratios of their previously computed energy spent within the virtual machines.

Embodiments of the system 100 then sum the power consumption used during the activity period for the selected activity to obtain the total activity power consumption (box 380). Specifically, the power consumption measurements for each virtual machine working on the activity during the activity period and the portion of the power consumption of the untracked devices used during the activity period are summed. This yields the total activity power consumption, or the power consumption used in the execution of the activity over all virtual machines used in the activity, regardless of which physical host server the virtual machines reside. The total activity power consumption then is output (box 390).

The above discussion uses the terms "energy usage" and "power consumption." These may be reported in units of energy (such as Joules or Kilowatt Hours). Power consumption may also be reported in terms of power drawn, using units of power (such as Watts). In the case where the reporting is in terms of power, a time series representing power drawn over unit time intervals may be provided. The total activity power consumption may be reported as a single number in units of energy per virtual machine activity, or as a single number in units of energy per virtual machine over the activity period. Alternatively, the total activity power consumption may be reported as a time series with multiple values in units of power over the activity period.

IV. System and Operational Details

The system and the operational details of embodiments of the virtual machine power metering system 100 and method now will be discussed. These embodiments include embodiments of the power model training module 200, the energy calculation module 210, the power model augmentation module 290, and the power capping module 220. The system and operational details of each of these modules now will be discussed in detail.

IV.A. Power Model Training Module

Figure 4:
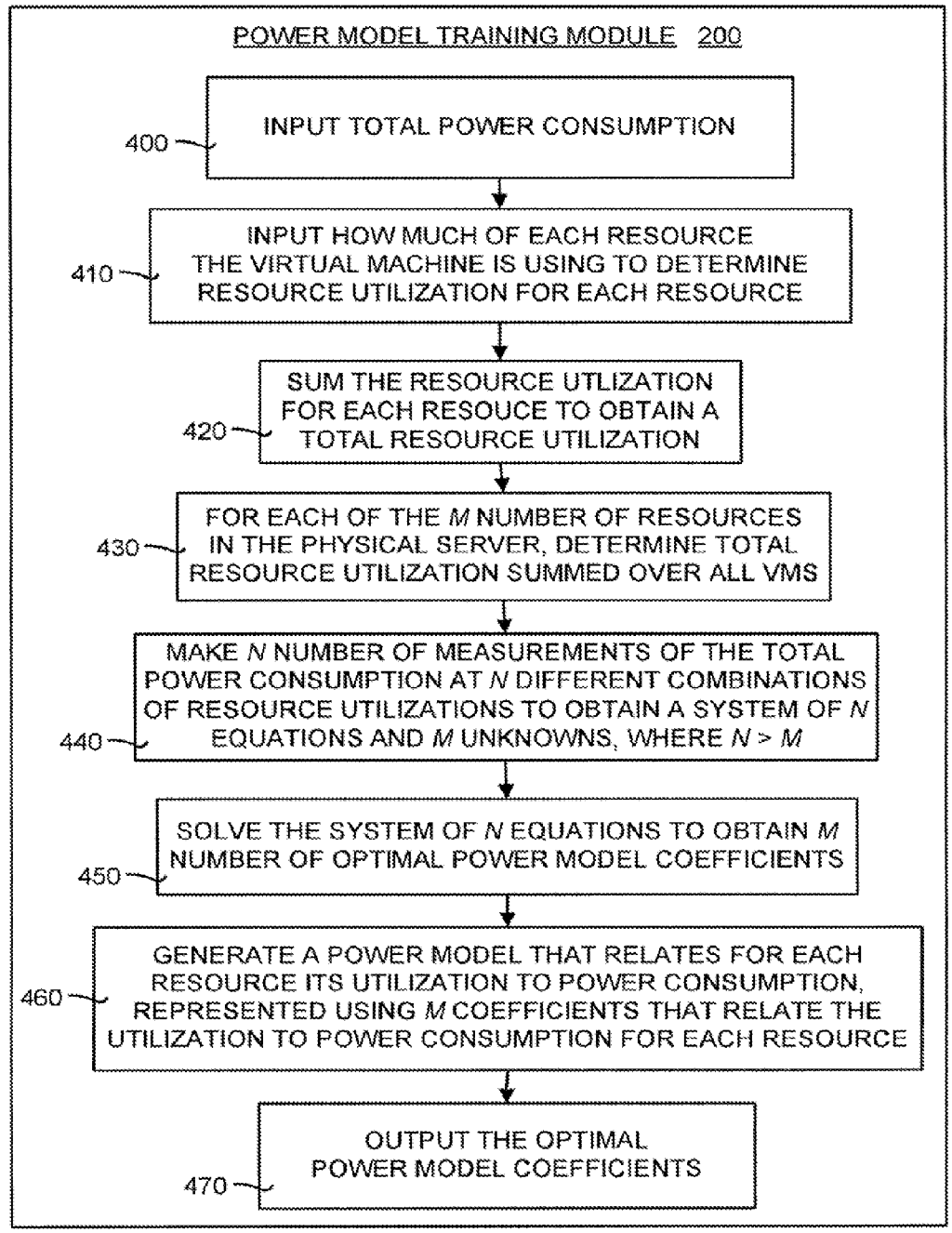
FIG. 4 is a flow diagram illustrating the operational details of embodiments of the power model training module shown in FIG. 2.

The power model training module 200 generates a power model that is used to determine the power consumption for a virtual machine. FIG. 4 is a flow diagram illustrating the operational details of embodiments of the power model training module 200 shown in FIG. 2. The method begins by inputting the total power consumption (box 400). This is reported by the power tracing module 130. In other words, the host server computing device 110 reports the total power used to the power tracing module 120.

Another input is a breakdown of how much of a given resource the virtual machine is using (box 410). This information is reported by the resource tracing module 140. A "resource" can be any component that is part of the computer infrastructure of the host server computing device 110. For example, a resource may be processor (such as a central processing unit (CPU)), a disk, memory, and so forth. The resource tracing module 140 determines how much of each resource is being utilized by a virtual machine (called "resource utilization"). The resource utilization for each resource then is summed to obtain a total resource utilization (box 420).

The host server computing device 110 includes a host operating system (not shown) that allocates these resources to any virtual machines residing thereon. For example, the host operating system may say that a virtual machine can get up to 30% of the CPU deposit. When the host operating system reserves this 30% it also tracks that the virtual machine is currently using 17% of its allocated 30% of the CPU deposit. So the host operating system both enforces that it never goes above the 30% and tracks what the virtual machine is currently using. This is done for each virtual machine residing on the host server computing device 110. In this way the host server computing device 110 gives the resource tracing module information about how much of a resource each virtual machine is using.

Let M denote the number of resources and let N denote the number of observations. For each of the M number of resources in the physical server, embodiments of the module 200 determine a total resource utilization that is summed over all virtual machines (box 430).

In general, a power model is generated based on the resource utilization for each virtual machine. This is done by taking the utilization of each resource and summing over all the resources being used by the virtual machine to obtain the total resource utilization. Mathematically, assume that there are three resources being used by the virtual machine and that $a_1$, $a_2$, and $a_3$ are optimal power model coefficients, which are constants. The power model then relates the resource utilization to total power consumption (TPC) as follows:

$$a_1*(\text{CPU utilization})+a_2*(\text{disk utilization})+a_3*(\text{network utilization})=\text{TPC}.$$

Theoretically, if three different measurements of the total power consumption are made for three different values of the resource utilization, then we have three equations and three unknowns. Thus, embodiments of the module 200 determine the M number of resources being used by the virtual machine. A system of M equations can be solved to determine the M unknowns. However, in practice, most embodiments of the system collect a N measurements, where N is greater than M. Known methods to fit a model (such as linear regression) then are used to determine the values of M variables that would best fit the N equations. The use of a N that is greater than M helps overcome measurement noise and such variations.

In particular, embodiments of the module 200 make N number of measurements of the total power consumption of the host server computing device 110 at N different combinations of resource utilizations (box 440). This gives a system of N equations and M unknowns. This system of N equations then is solved to obtain M number of optimal power model coefficients (box 450).

Next, embodiments of the module 200 generate a power model that relates for each resource its utilization to power consumption (box 460). This is represented using M coefficients that relate the utilization to power consumption for each resource. This power model is used to measure the power used by a virtual machine. Conceptually, the power used by the virtual machine is measured by tracking the hardware resources (such as the CPU, disk, memory, network, and so forth) used by the virtual machine. The output of embodiments of the module 200 is the optimal power model coefficients (box 470).

The following example demonstrates how the power models can be obtained and how the resource usage on each hardware resource can be tracked. Consider the CPU as a first resource, and suppose that multiple virtual machines, denoted as $VM_1$, $VM_2$, to $VM_N$, are hosted on a single physical host server. Then, suppose that two cores of the N-core CPU are used by $VM_1$ for time period $t_1$ to $t_2$. Suppose each of these two cores is used to 70% of capacity.

Suppose that when no virtual machine is using the CPU that its power usage is $P_{idle}$. Moreover, suppose when one core is fully used the power consumption is $P_{idle}+P_{core}$ and when one core is used to $x_1$% utilization, the power consumption is $P_{idle}+(x_1/100)*P_{core}$. Suppose the utilization of all cores 1 to n is denoted $x_1, x_2, \ldots, x_N$. Then, mathematically the power usage can be written as:

$$P_{CPU}=P_{idle}+(x_1/100)*P_{core}+(x_2/100)*P_{core}+\ldots+(x_N/100)*P_{core}$$

The above equation is an example of a power model for the CPU. The power model relates the usage (denoted by utilization percentages, $x_1, x_2, \ldots, x_N$) to the power usage. Note that this is one example of a power model. A more sophisticated model that includes not just the utilization of each core but also the types of instructions being executed by the processor and other more detailed information also may be used.

Continuing the above example where a virtual machine used 70% of two cores, the power model above can be used to say that between times $t_1$ and $t_2$ the virtual machine drew power in the CPU at a rate $P_{VM:CPU}=(70/100)*P_{core}+(70/100)*P_{core}$. Similarly, using a power model for the other hardware components (such as disk, memory, network, and so forth), the power drawn by the virtual machine can be computed for each component. Then the power drawn by each component is added up to obtain the total power drawn by the virtual machine.

In the above example, $P_{idle}$ for CPU was not assigned to the virtual machine. The user may consider $P_{idle}$ as wasted power regardless of whether a virtual machine is present or not and hence feel that it is not needed. Other users may consider that $P_{idle}$ is spent on maintaining a server which is needed because of the virtual machines. In this case, the $P_{idle}$ could be added to the power drawn by the virtual machines, either divided equally among all virtual machines using the server, or divided proportionally in the ratios of their other power drawn.

The details of some practical power models for a variety of system resources now will be discussed. Embodiments of the power model training module 200 use these models to relate the resource utilization to the total power consumption of the host server computing device 110 and thereby measure the power used by a virtual machine.

IV.A.1. Practical Power Model for CPU

The power usage of the CPU depends on several factors, such as the sub-units within the processor that are active, specific instructions executed, on-chip cache usage, if the processor has dynamic voltage frequency scaling (DVFS), sleep state usage over time, and the frequency used (denoted as P-state). To be precise, only DVFS frequency states are referred to as P-states and DFS states are referred to as Throttle (or T-states). In this document P-state is used to represent all frequency levels as the distinction is not relevant in this context. An accurate power estimation considering these factors can be achieved using a cycle accurate simulator. However, that requires a complete architectural model of the processor, and has high processing overheads, making it unsuitable for runtime virtual machine power metering.

A lighter weight alternative is to track processor states that capture the major power usage changes. Suppose there are m P-states, denoted as P0, P1, . . . , Pm, representing progressively lower frequencies. When the processor is not actively executing any thread it enters a low power sleep state, referred to as a C-state. By convention, C0 is used to denote the active state and C1, C2, . . . , Cn represent progressively deeper sleep states, where n is the number of sleep states (typically n ∈ {3, . . . , 6}. Suppose the instantaneous power used by the processor at time t is $P_{CPU}(t)$. Assuming that the power depends on only the P-states and C-states, it can be denoted by a constant in each different combination of frequency p(t) and sleep state c(t) at time t:

$$P_{cpu}(t) \qquad (1)$$

where $k_{p,c}$ represents the power used in P-state and C-state combination p, c. If it were possible to measure $P_{CPU}(t)$ with every P-state and C-state change, then learning the values of $k_{p,c}$ would be easy. Measurement at microsecond granularity is feasible on specially instrumented motherboards but not on realistic platforms. Instead, power can be measured at coarser time granularity (on the order of a second). Hence, embodiments of the power model training module 200 integrate the above power model over a longer time duration, T, say:

$$\int_0^T P_{cpu}(t)\,dt = \sum_{p,c} k_{p,c} * \Delta T_{p,c} \qquad (2)$$

Where $\Delta T_{p,c}$ represents the time spent in state {p, c} during the duration T and the summation is taken over all (p, c) combinations. The above equation then can be expressed in terms of observable quantities that are available on real systems, as follows.

For a given P-state, the energy spent in all sleep states C1 and higher may be approximated as $k_{p,sleep}$ since the differences are small relative to other approximations made. The active energy is $k_{p,C0}$. Let $E_{CPU}(T)$ denote the integral of the power over T. Also, P-state changes are slow and hypervisor counters often allow updates at interval Tsuch that the P-state is constant over T. Then, assuming a single P-state p for the duration T, yields:

$$E_{cpu}(T) = k_{p,C0}u_{cpu}(p)T + (1 - u_{cpu}(p))k_{p,sleep}T \qquad (3)$$

$$= (k_{p,C0} - k_{p,sleep})u_{cpu}(p)T + k_{p,sleep}T \qquad (4)$$

where $u_{CPU}(p)$ represents the percentage of time the processor was active during T, in fixed P-state p. Let $\alpha(p)=(k_{p,C0}-k_{p,sleep})$. Also let the sleep state energy in lowest frequency state, $k_{Pm,sleep}$, be denoted as $\gamma_{CPU,idle}$ and the increase in sleep state energy for higher frequencies be denoted $\gamma(p)=k_{p,sleep}-k_{Pm,sleep}$. Then, taking T=1 second for convenience:

$$E_{cpu}=\alpha(p)u_{cpu}(p)+\gamma(p)+\gamma_{cpu,idle} \qquad (5)$$

where $u_{CPU}(p)$ is readily available as an hypervisor performance counter and may thus be used on a real platform to monitor the processor state. If the model parameters are known, the processor energy can be estimated. The method to learn parameters $\alpha(p)$, $\gamma(p)$, and $\gamma_{CPU,idle}$ is described in detail below together with the power models for other resources.

Assigning the CPU usage to relevant virtual machines requires accounting for the exact chip resources used by the virtual machine, including the shared caches and processing components. Embodiments of the virtual machine power metering system 100 use a light weight approach that simply tracks when a virtual machine is active on a processor core (as is possible by tracking the context switches for every core). The energy used can be tracked using Equation (1) during the durations when the virtual machine is active on the processor. Processor context switch events are available on the many types of hypervisors. Re-writing in terms of a more readily available performance counter, the processor utilization of virtual machine A, denoted $u_{CPU,A}(p)$, and assuming that the P-state stays constant during interval T, the energy usage of a virtual machine A, denoted $E_{CPU,A}$, can be written as $$E_{cpu,A}=\alpha(p)u_{cpu,A}(p) \qquad (6)$$

again taking T=1 second. Note that the processor idle energy (spent in sleep states) is not included in the above discussion as embodiments of the power model training module 200 report it separately.

IV.A.2. Practical Power Model for Memory

A true estimate of memory energy usage may use a cycle accurate simulation of its hardware design. However, prior memory power models have found that the key factor that affects memory energy usage is the read and write throughput. While external instrumentation has been attempted to capture memory throughput accurately, a low overhead estimate of memory throughput is the last level cache (LLC) miss counter available in most processors. Using this metric, memory power consumption may be written as:

$$E_{Mem}(T)=\alpha_{mem}N_{LLCM}(T)+\gamma_{mem} \qquad (7)$$

where $E_{Mem}(T)$ represents the energy used by memory over time duration T, $N_{LLCM}(T)$ is the number of LLC misses during T, and $\alpha_{mem}$ and $\gamma_{mem}$ are the linear model parameters.

Since embodiments of the module 200 use LLC misses as an approximation for throughput, misses corresponding to each virtual machine are tracked. On a single core system, embodiments of the module 200 can assign the LLC misses during the time a virtual machine has the active context on the processor as the LLC misses for that virtual machine. Thus, the memory energy used by a virtual machine A becomes:

$$E_{Mem,A}(T)=\alpha_{mem}N_{LLCM,A} \qquad (8)$$

where $\alpha_{mem}$ is the same as in Equation (7) and $N_{LLCM,app}$ represents the number of LLC misses while the virtual machine was active on the processor.

IV.A.3. Practical Power Model for Disk

While several power models have been developed for disks, this sub-system remains the hardest to model. The difficulty arises due to lack of visibility into the power states of a hard disk and the impact of disks' hardware caches. Further, in data center servers, disks are mostly used in RAID arrays and even when RAID-0 is used only the RAID controller hardware controls the physical disks while the hypervisor only sees the logical drives. Some embodiments of the power model training module 200 may use only hypervisor-observable parameters for ease of implementation. Alternate embodiments are possible, such as where the RAID controller is modified to expose the greater details about disk power states and mechanical motion.

The hypervisor can observe the number of bytes read and written as well as the service times for those reads and writes. However, for individual virtual machines, current hypervisors only track bytes read or written. These are used in the disk energy model, which can be written as follows:

$$E_{Disk}(T) = \alpha_{rb} b_R + \alpha_{wb} b_w + \gamma_{disk} \quad (9)$$

where $E_{Disk}(T)$ represents the energy consumed by the disk over time duration T, and $b_r$ and $b_w$ are the number of bytes read and written respectively during the interval T. The $\alpha$ parameters and $\gamma_{disk}$ are model parameters to be learned.

This model involves approximations since disk spin up/down actions, which are not visible outside of the RAID controller, are not captured. Variable spin speeds are not captured but, as multi-speed disks are not commonly used in data centers, this is not a serious concern.

As for other resources, embodiments of the power model training module 200 track the disk usage parameters in equation (9) for individual virtual machines. The time at which the disk activity occurs is usually not the same as when the virtual machine is active on the processor, since the hypervisor may batch IO interrupts and buffer IO operations. Thus instead of looking at storage system activity during the active context of a virtual machine, the IO operations need to be explicitly tracked in the hypervisor. Fortunately, the many hypervisors already do most of this tracking and can be used to report the IO activity of each virtual machine separately. This yields the following disk energy model for a particular virtual machine A:

$$E_{Disk,A} = \alpha_{rb} * b_{r,A} + \alpha_{wb} b_{w,A} \quad (10)$$

where $b_{r,A}$ and $b_{w,A}$ represent the number of bytes read and written, respectively, by virtual machine A. Further, it has been found that the difference in energies for disk read and write to be negligible and hence a common parameter, say $b_{io}$, can be used to represent the sum of bytes read and written. This changes the model to:

$$E_{Disk}(T) = \alpha_{io} b_{io} + \gamma_{Disk} \quad (11)$$

Virtual machine disk energy can, for the embodiment described above, be computed using:

$$E_{Disk,A} = \alpha_{io} * b_{io,A} \quad (12)$$

IV.A.4. Other Resources

The dynamic range of power usage due to other resources was found to be small and they do not need to be modeled in all embodiments of the power model training module 200. However, the static energy use of those resources is included in the system idle energy in the model. Some of these resources may be important to model on other platforms. Some slower network cards, for example, do not show a wide variation in energy use with network activity but higher speed cards do use more energy in driving the physical medium, and this energy is likely to vary with network activity. With servers that use multiple such cards, modeling the network energy will thus be important.

Many servers do not vary their fan speeds, but if variable speed fans are used their contribution to dynamic energy may be modeled. Another effect that may be considered in some embodiments is the change in power supply efficiency as the power drawn changes.

IV.A.5. Power Model Parameter Training

The power models in Equations (5), (7), and (11) use certain coefficients, denoted by $\alpha$'s, and $\gamma$'s, that need to be learned in situ on the servers. Realistic platforms do not allow measuring $E_{CPU}(T)$, $E_{Mem}(T)$, and $E_{Disk}(T)$ separately but only the full system power, denoted $E_{sys}(T)$. Define a quantity, $E_{static}(T)$, to represent the energy used by the non-modeled resources in the system. Then, assuming T=1 as before, an equation can be written as:

$$\begin{aligned} E_{sys} &= E_{cpu} + E_{Mem} + E_{Disk} + E_{static} \\ &= \alpha(p) u_{cpu}(p) + \gamma(p) + \gamma_{cpu,idle} + \alpha_{mem} N_{LLCM} + \\ &\quad \gamma_{mem} + \alpha_{io} b_{io} + \gamma_{disk} + E_{static} \end{aligned} \quad (13)$$

The following points are worth noting regarding Equation (13) and lead to slight modifications for actual implementation. First, with the above summation, since the constants $\gamma_{CPU,idle}$, $\gamma_{mem}$, $\gamma_{disk}$, and $E_{static}$ do not have any observable parameters that vary across observations, their individual values from cannot be learned from measurements of $E_{sys}$. Their sum can hence be denoted as a single constant, $\gamma$. Second, note that the magnitude of $u_{CPU}(p)$ is a fraction between 0 and 1 while $N_{LLCM}$ and $b_{io}$ take values of the order of a hundred million. For numerical stability, $N_{LLCM}$ and $b_{io}$ can be normalized with respect to their maximum values observed on a system, such that the $\alpha$ parameters are scaled to similar magnitudes. The final equation used in learning thus becomes:

$$E_{sys} = \alpha(p) u_{cpu}(p) + \gamma(p) + \alpha_{mem} u_{mem} + \alpha_{io} u_{disk} + \gamma \quad (14)$$

where $u_{mem}$ and $u_{disk}$ represent the normalized value of $N_{LLCM}$ and $b_{io}$ respectively. In summary, there are m*2+3 unknown model parameters: $\{\alpha(p), \gamma(p)\}_p^m = 1$, $\alpha_{mem}$, $\alpha_{io}$, and $\gamma$, where m is the number of P-states, and four observables that are available on real hardware without extra instrumentation: $E_{sys}$, $u_{CPU}$, $U_{mem}$, and $u_{disk}$.

Taking multiple observations of the observable quantities allows estimating the model parameters using learning techniques such as linear regression with ordinary least squares estimation. The output of the power model training module 200 are the optimal power model coefficients 260.

IV.B. Energy Calculation Module

The energy calculation module 210 uses the optimal power model coefficients from the power model training module 200 to obtain the power consumption for a virtual machine. In particular, The learned coefficient values are used in Equations (6), (8), and (12) and the computed resource energies are summed up to determine the energy usage of each VM. In fact the energy used by the virtual machine on each resource can be reported separately, if desired. There are two embodiments of the energy calculation module 210. Each of these embodiments now will be discussed.

IV.B.1. First Embodiment for Energy Calculation

Figure 5:
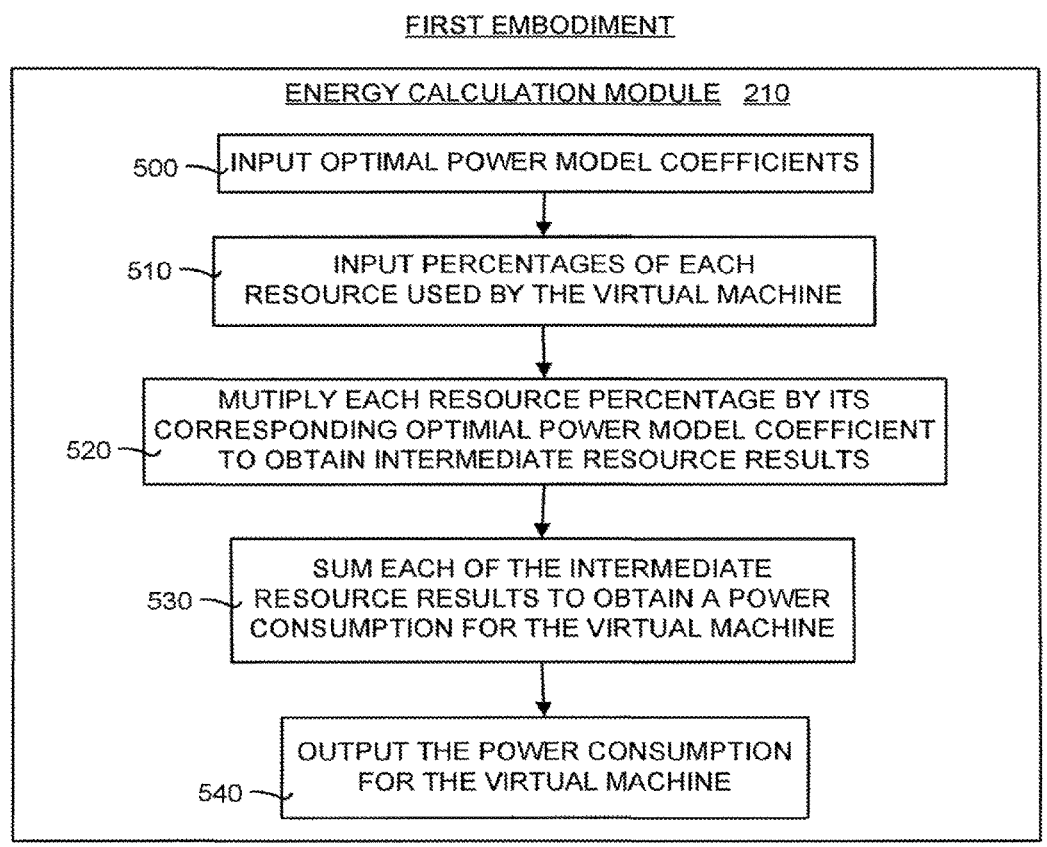
FIG. 5 is a flow diagram illustrating the operational details of a first embodiment of the energy calculation module shown in FIG. 2.

The first embodiment of the energy calculation tracks resource percentages to obtain the power consumption of a virtual machine. FIG. 5 is a flow diagram illustrating the operational details of a first embodiment of the energy calculation module 210 shown in FIG. 2. The method begins by inputting the optimal power model coefficients (box 500). The method also inputs the percentages of each resource that is used by the virtual machine (box 510).

Each resource then is multiplied by its corresponding optimal power model coefficients to obtain intermediate resource results (box 520). Each of the intermediate resource results then are summed to obtain a power consumption for the virtual machine (box 530). For example, for each virtual machine the percentage of the CPU resource used by the virtual machine plus the percentage of the disk resource used by the virtual machine, and so forth, and is summed over all of the resources. The output of the module 210 is the power consumption of the virtual machine (box 540).

This first embodiment generates linearly independent combinations of power states in Equation (14) through controlled workloads that cause various resource power states to be used. This approach is a basic approach and has the lowest overhead since one workload is used for training. However, the controlled workloads may not use the processor and other resources in a manner representative of real workloads.

IV.B.2. Second Embodiment for Energy Calculation

The second embodiment of the energy calculation tracks more specific information than the first embodiment. This second embodiment is a variation on the first embodiments that makes the equation a little more specific. Instead of just tracking resource percentages, we track a CPU % working for a virtual machine. This takes into account the type of work that the virtual machine is doing. This leads to a more complex equation that takes into account the nature of work being done by each of the virtual machines.

Figure 6:
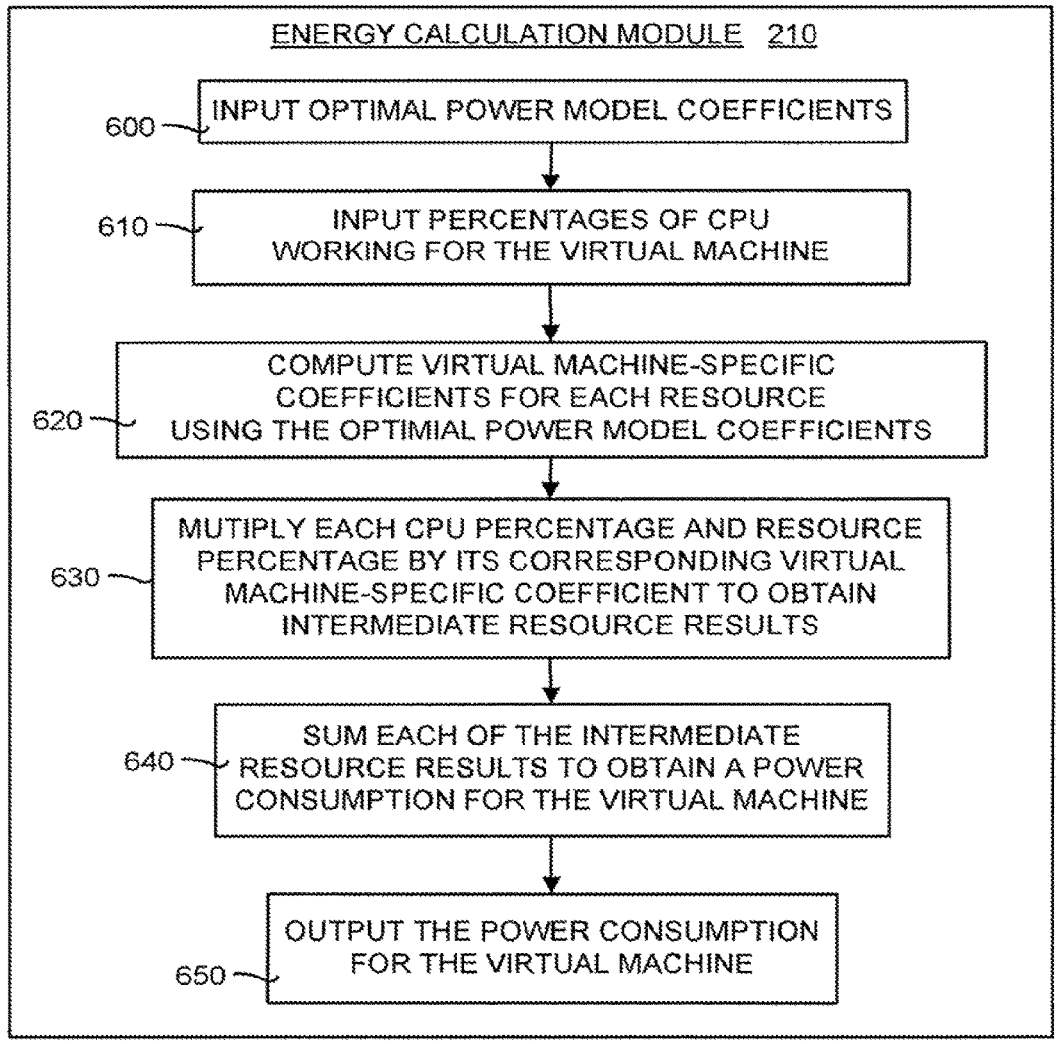
FIG. 6 is a flow diagram illustrating the operational details of a second embodiment of the energy calculation module shown in FIG. 2.

FIG. 6 is a flow diagram illustrating the operational details of a second embodiment of the energy calculation module 210 shown in FIG. 2. The method begins by inputting the optimal power model coefficients (box 600). In addition, the method inputs the percentages of the CPU working for a particular virtual machine (box 610). Next, embodiments of the module 210 compute virtual-machine specific coefficients for each resource using the optimal power model coefficients (box 620).

For example, it could be the case where $VM_1$ is using 10% of the CPU (say 10 Watts) and $VM_2$ is using 10% of the CPU (say 12 Watts). The second embodiment takes this into account. This means that the second embodiment also uses virtual machine-specific coefficients, such that the $\alpha_{1,VM1}$ is the $\alpha_1$ value that works for $VM_1$, $\alpha_{1,VM2}$ is the $\alpha_1$ value that works for VM2, and so forth. In other words, each of the $\alpha_1$'s are for a first resource (such as the CPU resource), and the $\alpha_2$'s are for a second resource (such as the disk resource), and so forth.

Each CPU percentage and resource percentage then is multiplied by its corresponding virtual-machine specific coefficient to obtain intermediate resource results (box 630). Each of the intermediate resource results then are summed to obtain a power consumption for the virtual machine (box 640). The output of the module 210 is the power consumption of the virtual machine (box 650).

The power model augmentation module 290 augments the above power models by taking into account the fact that CPUs can operate a different frequencies. The power augmentation module 290 is used to overcome the accuracy limitations of the two embodiments set forth above. The general idea of the power augmentation module 290 is that the model parameters (or optimal power model coefficients) for each virtual machine are learned separately. Since for a given workload, the unobserved power states are highly correlated to the observed ones, the model based on a small number of observed states will capture the power usage more accurately. In fact, with the power model augmentation module 290, even if the processor counter for LLC misses is not captured due to portability limitations across processors, that simply becomes another unobserved state that for a given workload may be correlated with observed states.

V. Power Metering Application

The virtual machine power metering system 100 and method includes the virtual machine power metering techniques that were set forth above. These virtual machine power metering techniques can be used for various power management decisions. One of these power management decisions and applications will now be discussed, namely, power capping.

V.A. Power Capping Module

The power capping module 220 uses the power consumption computed for each virtual machine using the above techniques for a power capping technique for virtual machines. This virtual machine power capping allows virtual machines to be hosted in power over-subscribed circuits, leading to significant advantages in power provisioning costs.

In order to better explain the operation of the power capping module 220, the power capping concept in over-subscribed circuits as used for physical servers (without virtual machines) will first be described. Imagine that a server is rated for power $P_{rat}$. Then, a conventionally provisioned power distribution circuit will have enough power capacity to supply $P_{rat}$ to all servers connected to that circuit. However, a server rated for $P_{rat}$ can only use $P_{rat}$ if each component of the server (CPU, disk, motherboard chipsets, memory, and so forth) is used to its full power at the same time. In reality, this does not happen. When the CPU is busy accessing the memory it is possible that the disk is not fully used, and when the CPU is busy processing data, it is possible that memory is not fully used. A realistic workload thus uses lower power than $P_{rat}$. Suppose the maximum of the actual power used by any combination of software intended to be executed on the server is denoted $P_{act}$. Then, a power distribution circuit that has a capacity to supply only $P_{act}$ per server could be used. Since $P_{act}$ is lower than $P_{rat}$, the power circuit is said to be over-subscribed since it is possible (though unlikely) that the power capacity is exceeded. For instance, capacity may be exceeded if some unexpected combination of software that uses more resources simultaneously than any previously measured software combination is executed.

If the power capacity is exceeded, the circuit breaker will trip causing multiple servers served by that circuit to stop working. This is clearly not desirable. Thus, it is desirable that if a server is provisioned for $P_{act}$ power capacity, it stay within $P_{act}$. The method to ensure that each physical server stays within $P_{act}$ is known as power capping. Typically, it is implemented in server motherboard's firmware. When the server exceeds $P_{act}$ its resource usage is throttled (for instance the CPU frequency could be lowered) to keep power usage below $P_{act}$.

However, the above power capping method does not apply directly to virtual machines. As noted earlier in this document, if the physical server hosting multiple virtual machines is capped by throttling the physical resources (such as CPU frequency) in the server, it may cause multiple virtual machines to be throttled even when it is just one virtual machine that exceeded its power rating. Clearly it is desirable to enforce power capacity limits on each virtual machine separately. The power capping module 220 uses the virtual machine metering information described above to enable power capping for virtual machines.

Figure 7:
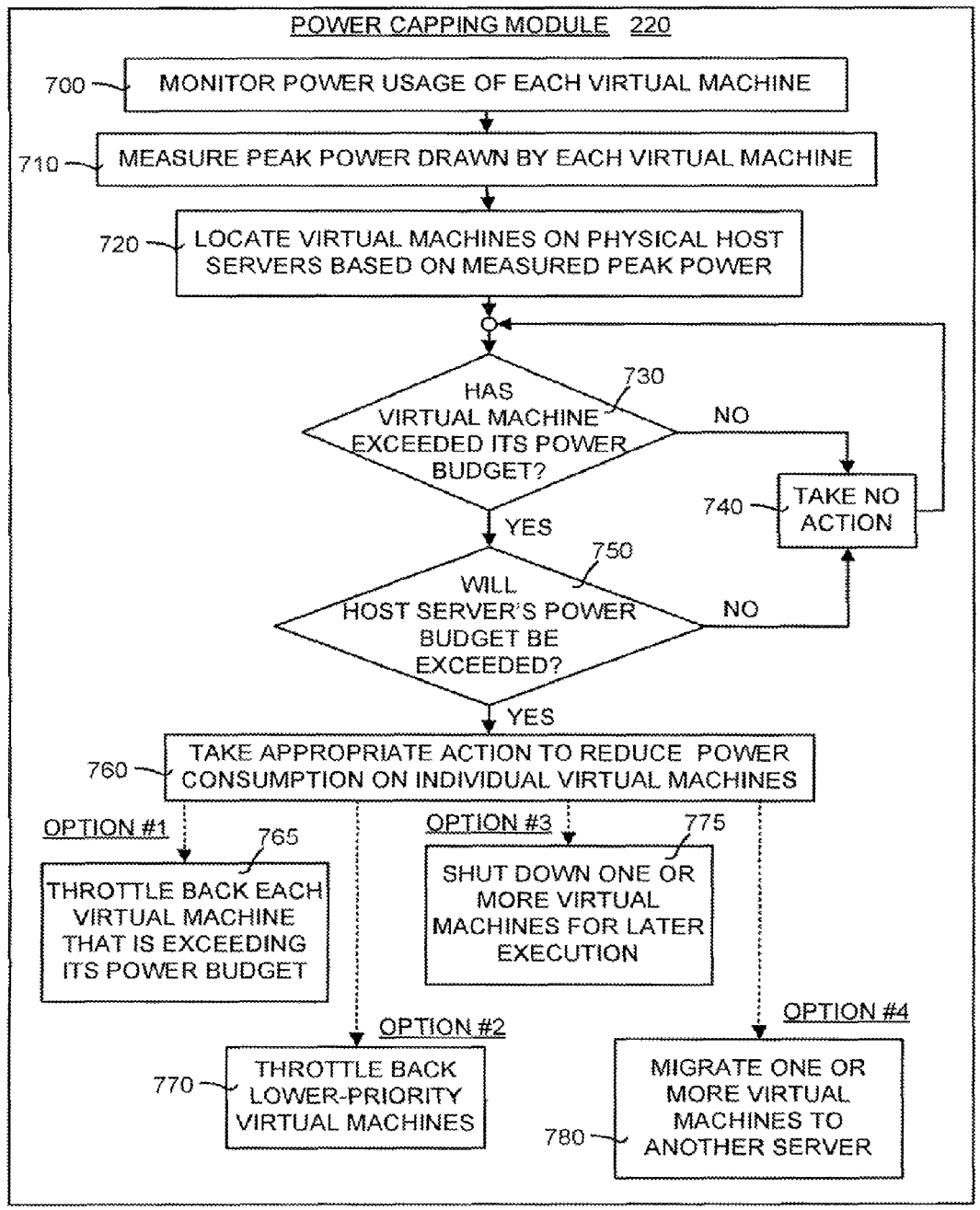
FIG. 7 is a flow diagram illustrating the operational details of embodiments of the power capping module shown in FIG. 2.

FIG. 7 is a flow diagram illustrating the operational details of embodiments of the power capping module 220 shown in FIG. 2. First, the power usage of each virtual machine is monitored (box 700). The peak power drawn by that virtual machine is measured (box 710) and virtual machines are placed on physical host servers such that the sum of their peaks is less than or equal to the power capacity allocated to that server (box 720).

Next, a determination is made as to whether a virtual machine has exceeded its power budget (box 730). If not, then no action is taken (box 740). If so, then when a virtual machine has exceeded (or is about to exceed) its power budget, the module 290 checks whether this excess will cause the physical server's power budget to be exceeded (box 750). If some of the virtual machines are exceeding their budget but enough other virtual machines are operating below their budget such that the physical server as a whole is below the allocated power capacity limit, there is no danger of a circuit breaker tripping. In this case no action needs to be taken (box 740).

On the other hand, if one or more virtual machines are exceeding their power budget such that the physical server hosting those virtual machines has exceeded (or is about to exceed) its allocated power capacity, then an appropriate action is taken on individual virtual machines to reduce power usage on this server (box 760). Note that the entire server is not throttled (unlike existing techniques). The appropriate action includes one of multiple options. Note that each of the following options is shown in FIG. 7 as being connected with a dashed arrow to indicate that any of the four options may be used.

A first option is that the virtual machines that are exceeding their power budget are throttled to the power level that allows the server to be within its allocated capacity (box 765). Throttling may be implemented by reducing the amount of CPU time allocated to that VM. A second option is that the virtual machines are allowed to operate at higher power but some other lower priority virtual machines are throttled to reduce overall power usage (box 770). For example, a revenue generating virtual machine may be allowed to run above its budget and some background tasks may be throttled temporarily. A third option is that one or more virtual machines are migrated from this server to another server that has excess capacity (box 775). A fourth option is that one or more virtual machines are shut down to be executed later (box 780). Additional options, which are not shown in FIG. 7, include reducing the number of requests being submitted to the virtual machines, and increasing the number of virtual machines on other servers where excess power capacity.

In other embodiments of the power capping module 220, a variation of the above method is used. In reality, the virtual machines (or the applications hosted on the virtual machines) have a variable user load. The peak user load occurs only for a small duration of the day and at other times they are operating below peak. In effect the peak of the sum of the power usages of the virtual machine is lower than the sum of the peaks of the power usages. Also, the peak load of multiple virtual machines sharing a server may occur at different times. Hence, rather than allocating power capacity for peak load, some embodiments of the power capping module 220 allocate power capacity for a level lower than the peak. When the server power capacity is exceeded, an appropriate action similar to the above method (such as throttling individual VMs, migrating VMs to other servers, and so forth) is used.

V.B. Energy Metering of Distributed Activities

Computational activities in a computing infrastructure (such as a data center) often consist of multiple tasks performed by multiple virtual machines or server roles hosted on different physical machines. For example, a search query may be first received by a web front end service (also referred to as web frontend server role) and may be hosted inside a virtual machine. The search query then may be processed by multiple search data retrieval servers, advertisement servers, and content-rendering servers. The results of the processing are collected and sent to the user. As another example, an activity may consist of receiving an email for a particular user. First an incoming-email server role (possibly hosted within a virtual machine) will receive the message and determine the correct user account for the message. A virus-scanning server may check the contents of the email message. A spam-filtering server may check the contents of the message as well. Then a storage server may place the message in its storage. The activity in each case involves expenditure of energy on multiple distributed server roles some of which could be hosted on the same machine and some on different machines. It is desirable to determine the energy used by the activity as a whole.

The virtual machine power metering system 100 and method also includes a technique to determine the energy usage of an individual activity that may be distributed over several virtual machines. An activity is defined as a service or request. For example, a search query is an activity that has a verifiable beginning and end.

In particular, when the activity is initiated an event is generated. This begins the tracking of each resource that is used by the activity. For example, when an activity uses a particular server role, the energy usage of the relevant server role is determined over the duration of the activity's use using previously described methods to monitor energy usage of virtual machines. As noted above, the activity could start and end on different virtual machines at different times. As the activity progresses, the energy used across multiple server roles is added up to generate the total energy used by the activity.

In addition, some energy may be spent by devices that are not part of the computing infrastructure as tracked by the virtual machine power metering method. These could include cooling equipment for the computing facility and such peripherals. The energy used in these devices is estimated as follows. The total energy used by those devices is measured using hardware power metering or using known power models (based on specifications and data sheets or learned in situ). Then, the total activity workload served by the computational facility is tracked using only the methods that monitor computing infrastructure that are accessible to the virtual machine power metering method. The total power consumption is then apportioned among all activities that are performed by the computing infrastructure. The total energy may be apportioned equally among all activities, divided in the ratio of their execution times, or in the ratios of their previously computed energy spent within the virtual machines.

The techniques presented herein use the term "energy usage" or "power consumption." These may be reported in units of energy (such as Joules or Kilowatt Hours). Power consumption may also be reported in terms of power drawn, using units of power (such as Watts). In the case where the reporting is in terms of power, a time series representing power drawn over unit time intervals may be provided.

VI. Exemplary Operating Environment

Embodiments of the virtual machine power metering system 100 and method are designed to operate in a computing environment. The following discussion is intended to provide a brief, general description of a suitable computing environment in which embodiments of the virtual machine power metering system 100 and method may be implemented.

Figure 8:
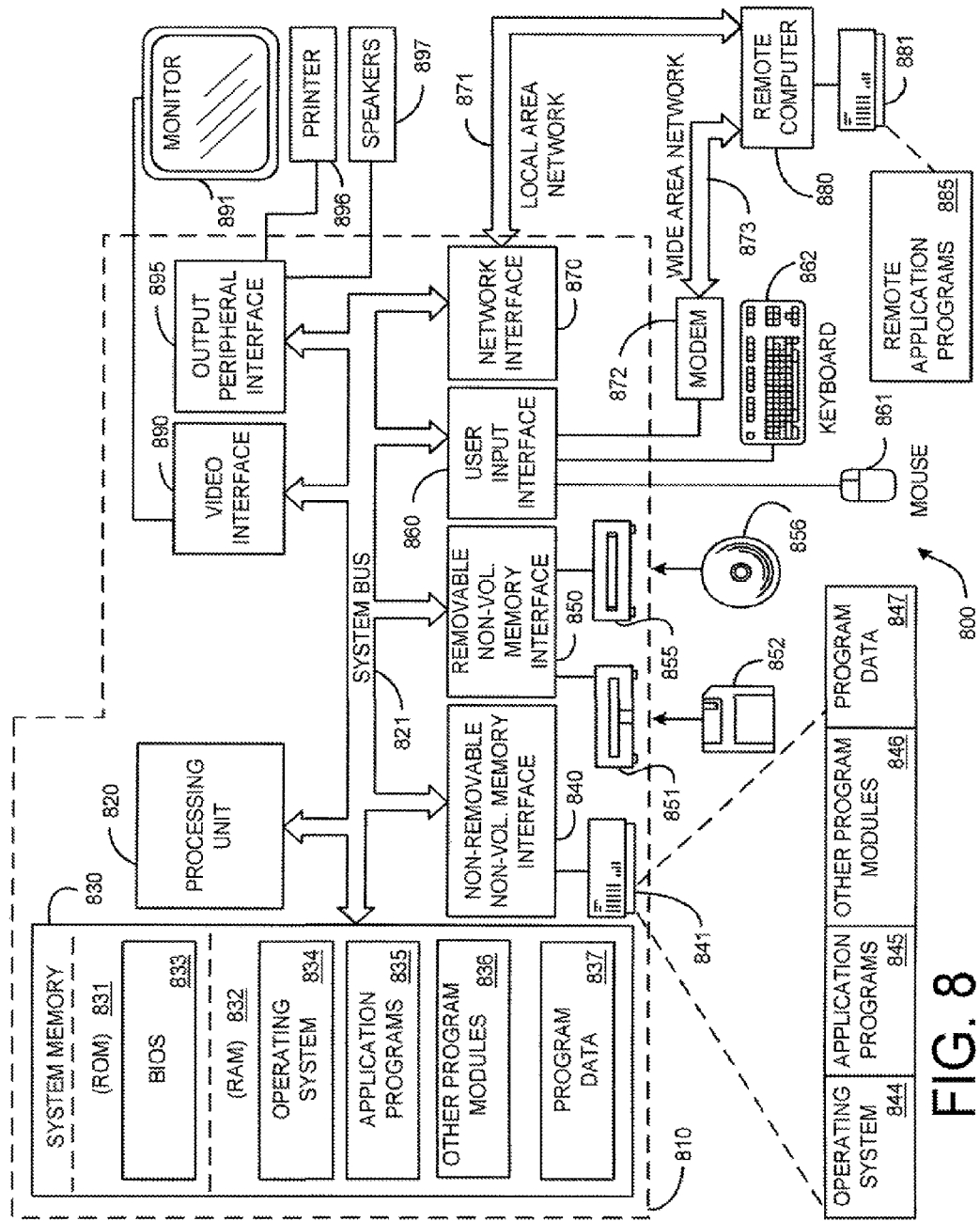
FIG. 8 illustrates an example of a suitable computing system environment in which embodiments of the virtual machine power metering system and method shown in FIGS. 1-7 may be implemented.

FIG. 8 illustrates an example of a suitable computing system environment in which embodiments of the virtual machine power metering system 100 and method shown in FIGS. 1-7 may be implemented. The computing system environment 800 is only one example of a suitable computing environment and is not intended to suggest any limitation as to the scope of use or functionality of the invention. Neither should the computing environment 800 be interpreted as having any dependency or requirement relating to any one or combination of components illustrated in the exemplary operating environment.

Embodiments of the virtual machine power metering system 100 and method are operational with numerous other general purpose or special purpose computing system environments or configurations. Examples of well known computing systems, environments, and/or configurations that may be suitable for use with embodiments of the virtual machine power metering system 100 and method include, but are not limited to, personal computers, server computers, hand-held (including smartphones), laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

Embodiments of the virtual machine power metering system 100 and method may be described in the general context of computer-executable instructions, such as program modules, being executed by a computer. Generally, program modules include routines, programs, objects, components, data structures, etc., that perform particular tasks or implement particular abstract data types. Embodiments of the virtual machine power metering system 100 and method may also be practiced in distributed computing environments where tasks are performed by remote processing devices that are linked through a communications network. In a distributed computing environment, program modules may be located in both local and remote computer storage media including memory storage devices. With reference to FIG. 8, an exemplary system for embodiments of the virtual machine power metering system 100 and method includes a general-purpose computing device in the form of a computer 810.

Components of the computer 810 may include, but are not limited to, a processing unit 820 (such as a central processing unit, CPU), a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 810 typically includes a variety of computer readable media. Computer readable media can be any available media that can be accessed by the computer 810 and includes both volatile and nonvolatile media, removable and non-removable media. By way of example, and not limitation, computer readable media may comprise computer storage media and communication media. Computer storage media includes volatile and nonvolatile removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computer 810. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer information between elements within the computer 810, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, application programs 835, other program modules 836, and program data 837.

The computer 810 may also include other removable/non-removable, volatile/nonvolatile computer storage media. By way of example only, FIG. 8 illustrates a hard disk drive 841 that reads from or writes to non-removable, nonvolatile magnetic media, a magnetic disk drive 851 that reads from or writes to a removable, nonvolatile magnetic disk 852, and an optical disk drive 855 that reads from or writes to a removable, nonvolatile optical disk 856 such as a CD ROM or other optical media.

Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 841 is typically connected to the system bus 821 through a non-removable memory interface such as interface 840, and magnetic disk drive 851 and optical disk drive 855 are typically connected to the system bus 821 by a removable memory interface, such as interface 850.

The drives and their associated computer storage media discussed above and illustrated in FIG. 8, provide storage of computer readable instructions, data structures, program modules and other data for the computer 810. In FIG. 8, for example, hard disk drive 841 is illustrated as storing operating system 844, application programs 845, other program modules 846, and program data 847. Note that these components can either be the same as or different from operating system 834, application programs 835, other program modules 836, and program data 837. Operating system 844, application programs 845, other program modules 846, and program data 847 are given different numbers here to illustrate that, at a minimum, they are different copies. A user may enter commands and information (or data) into the computer 810 through input devices such as a keyboard 862, pointing device 861, commonly referred to as a mouse, trackball or touch pad, and a touch panel or touch screen (not shown).

Other input devices (not shown) may include a microphone, joystick, game pad, satellite dish, scanner, radio receiver, or a television or broadcast video receiver, or the like. These and other input devices are often connected to the processing unit 820 through a user input interface 860 that is coupled to the system bus 821, but may be connected by other interface and bus structures, such as, for example, a parallel port, game port or a universal serial bus (USB). A monitor 891 or other type of display device is also connected to the system bus 821 via an interface, such as a video interface 890. In addition to the monitor, computers may also include other peripheral output devices such as speakers 897 and printer 896, which may be connected through an output peripheral interface 895.

The computer 810 may operate in a networked environment using logical connections to one or more remote computers, such as a remote computer 880. The remote computer 880 may be a personal computer, a server, a router, a network PC, a peer device or other common network node, and typically includes many or all of the elements described above relative to the computer 810, although only a memory storage device 881 has been illustrated in FIG. 8. The logical connections depicted in FIG. 8 include a local area network (LAN) 871 and a wide area network (WAN) 873, but may also include other networks. Such networking environments are commonplace in offices, enterprise-wide computer networks, intranets and the Internet.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the Internet. The modem 872, which may be internal or external, may be connected to the system bus 821 via the user input interface 860, or other appropriate mechanism. In a networked environment, program modules depicted relative to the computer 810, or portions thereof, may be stored in the remote memory storage device. By way of example, and not limitation, FIG. 8 illustrates remote application programs 885 as residing on memory device 881. It will be appreciated that the network connections shown are exemplary and other means of establishing a communications link between the computers may be used.

The foregoing Detailed Description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method comprising:
    monitoring power consumptions of a plurality of virtual machines on a host server;
    measuring peak power draws by the plurality of virtual machines on the host server;
    determining whether an individual virtual machine has exceeded a corresponding virtual machine power budget of the individual virtual machine; and
    in an instance when the individual virtual machine has exceeded the corresponding virtual machine power budget:
        determining whether a host server power budget of the host server has been exceeded; and
        responsive to a determination that the host server power budget has been exceeded, reducing a power consumption of the individual virtual machine by reducing an amount of processor time allocated to the individual virtual machine.

2. The method of claim 1, the reducing the amount of processor time allocated to the individual virtual machine being performed without reducing another amount of processor time allocated to another virtual machine that shares a processor with the individual virtual machine.

3. The method of claim 1, further comprising:
    generating a power model that relates a total resource utilization for each of the plurality of virtual machines to a total power consumption of the host server;
    using the power model to obtain optimal power model coefficients; and
    computing the power consumptions of the plurality of virtual machines using the power model and the optimal power model coefficients.

4. The method of claim 1, further comprising reducing power consumption of at least one other virtual machine that is exceeding a corresponding other virtual machine power budget so as to not exceed the host server power budget of the host server.

5. The method of claim 1, further comprising:
    in another instance when the individual virtual machine has exceeded the corresponding virtual machine power budget:
        determining whether the host server power budget has been exceeded; and
        responsive to another determination that the host server power budget has been exceeded, reducing the power consumption of the host server by reducing an amount of processor time allocated to another individual virtual machine that shares a processor with the individual virtual machine.

6. The method of claim 5, the another individual virtual machine having a relatively lower priority than the individual virtual machine.

7. The method of claim 1, further comprising migrating one or more of the plurality of virtual machines to another host server so as to not exceed the host server power budget.

8. A computing system comprising:
    one or more hardware resources including one or more processing units; and
    one or more computer-readable media storing computer readable instructions that, when executed by the one or more processing units, cause the one or more processing units to:
        measure hardware resource utilization of hardware resources by multiple virtual machines that execute on the computing system;

based at least on the measured hardware resource utilization, determine power consumption measurements of the multiple virtual machines that execute on the computing system;

determine that a first virtual machine of the multiple virtual machines has exceeded a first power budget of the first virtual machine; and reduce power consumption of the computing system by reducing an amount of processor time allocated to the first virtual machine on an individual processing unit that is shared by the first virtual machine and a second virtual machine that has not exceeded a second power budget of the second virtual machine.

9. The computing system of claim 8, wherein the computer readable instructions, when executed by the one or more processing units, cause the one or more processing units to:

based at least on the power consumption measurements, determine whether a physical power budget of the computing system will be exceeded;

throttle the first virtual machine when the physical power budget will be exceeded; and allow the first virtual machine to execute without being throttled when the physical power budget will not be exceeded.

10. The computing system of claim 8, wherein the computer readable instructions, when executed by the one or more processing units, cause the one or more processing units to:

detect a context switch on an individual processing unit from the first virtual machine to the second virtual machine; and determine the power consumption measurements such that:

a first power consumption measurement for the first virtual machine reflects first power consumption by the first virtual machine while the first virtual machine was active on the individual processing unit prior to the context switch, and a second power consumption measurement for the second virtual machine reflects second power consumption by the second virtual machine while the second virtual machine was active on the individual processing unit after the context switch.

11. The computing system of claim 8, wherein the computer readable instructions, when executed by the one or more processing units, cause the one or more processing units to:

obtain a model relating the hardware resource utilization to power consumption; and determine the power consumption measurements of the multiple virtual machines using the model.

12. The computing system of claim 11, the model having a first coefficient for processing unit utilization and a second coefficient for storage utilization, the power consumption measurements reflecting power consumed by the one or more processing units and storage hardware.

13. The computing system of claim 12, the model having a third coefficient for network utilization, the power consumption measurements reflecting power consumed by the one or more processing units, the storage hardware, and network hardware.

14. The computing system of claim 13, provided as a host server having a power sensor configured to measure the power consumption of the host server.

15. A computing system comprising:

one or more hardware resources including one or more processing units; and one or more computer-readable media storing computer readable instructions that, when executed by the one or more processing units, cause the one or more processing units to:

measure corresponding processor utilizations of multiple virtual machines when executing on the one or more processing units;

measure memory or storage utilizations of the multiple virtual machines;

determine power consumption measurements of the multiple virtual machines based at least on the processor utilizations and the memory or storage utilizations; and reduce power consumption of the computing system by throttling less than all of the multiple virtual machines.

16. The computing system of claim 15, further comprising a power sensor configured to measure overall power consumption of the computing system.

17. The computing system of claim 16, wherein the computer readable instructions, when executed by the one or more processing units, cause the one or more processing units to:

based at least on the overall power consumption measured by the power sensor, determine whether an overall power budget of the computing system has been exceeded; and throttle less than all of the virtual machines when the overall power budget of the computing system has been exceeded.

18. The computing system of claim 16, wherein the computer readable instructions, when executed by the one or more processing units, cause the one or more processing units to:

based at least on the overall power consumption measured by the power sensor, determine a model relating the processor utilizations and the memory or storage utilizations to the overall power consumption; and use the model to determine the power consumption measurements of the multiple virtual machines.

19. The computing system of claim 18, wherein the computer readable instructions, when executed by the one or more processing units, cause the one or more processing units to:

determine different virtual machine-specific models for different virtual machines.

20. The computing system of claim 19, an individual virtual machine-specific model accounting for floating point operations performed by an individual virtual machine, the floating point operations not being performed by at least one other virtual machine having another virtual machine-specific model.

* * * * *